United States Patent
Sterling (10) Patent No.: US 9,175,943 B2
(45) Date of Patent: *Nov. 3, 2015

(54) ANGLE MEASUREMENT SYSTEM INCLUDING MAGNET WITH SUBSTANTIALLY SQUARE FACE FOR THROUGH-SHAFT APPLICATIONS

(71) Applicant: Infineon Technologies AG, Neubiberg (DE)

(72) Inventor: James William Sterling, Novi, MI (US)

(73) Assignee: Infineon Technologies AG, Neubiberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 14/295,575

(22) Filed: Jun. 4, 2014

(65) Prior Publication Data

US 2014/0285187 A1  Sep. 25, 2014

Related U.S. Application Data

(63) Continuation of application No. 13/156,735, filed on Jun. 9, 2011, now Pat. No. 8,779,760.

(51) Int. Cl.
  *G01B 7/30* (2006.01)
  *G01D 5/14* (2006.01)
  *G01R 33/09* (2006.01)

(52) U.S. Cl.
  CPC *G01B 7/30* (2013.01); *G01D 5/145* (2013.01); *G01R 33/09* (2013.01)

(58) Field of Classification Search
  CPC ............................ G01D 5/145; G01D 11/245
  USPC ...................................... 324/207.25, 207.21
  See application file for complete search history.

(56) References Cited

U.S. PATENT DOCUMENTS

| | | | |
|---|---|---|---|
| 5,811,968 A * | 9/1998 | Nakazawa et al. | 324/207.2 |
| 6,191,579 B1 | 2/2001 | Striker | |
| 6,489,761 B1 | 12/2002 | Schroeder et al. | |
| 7,208,940 B2 * | 4/2007 | Withanawasam et al. | 324/207.25 |
| 7,358,724 B2 | 4/2008 | Taylor et al. | |
| 7,382,120 B2 | 6/2008 | Narasimhan et al. | |
| 7,420,363 B2 | 9/2008 | Hatanaka et al. | |
| 7,808,234 B2 | 10/2010 | Kurihara | |

(Continued)

FOREIGN PATENT DOCUMENTS

| | | |
|---|---|---|
| CN | 101586940 A | 11/2009 |
| WO | 2004113928 A2 | 12/2004 |

OTHER PUBLICATIONS

Non-Final Office Action dated May 9, 2013 for U.S. Appl. No. 13/156,735.

(Continued)

*Primary Examiner* — Reena Aurora
(74) *Attorney, Agent, or Firm* — Eschweiler & Associates, LLC (57) ABSTRACT

To make the magnetic field lines straighter and more parallel to one another, the present disclosure makes use of substantially square magnets with through-holes therein. It will be appreciated that "substantially square" magnets include magnets that are precisely square as well as magnets that are approximately square (e.g., have rounded corners or other small deviations from being square.) By providing straighter and more parallel magnetic field lines, such substantially square magnets tend to enable greater precision and accuracy when rotational angles of a shaft are measured.

18 Claims, 5 Drawing Sheets

(56) References Cited

U.S. PATENT DOCUMENTS

| | | |
|---|---|---|
| 2005/0068024 A1 | 3/2005 | Byram |
| 2008/0116884 A1 | 5/2008 | Rettig et al. |
| 2008/0218158 A1 | 9/2008 | Carlson et al. |
| 2009/0289623 A1 | 11/2009 | Sano |
| 2010/0315074 A1 | 12/2010 | Abe et al. |
| 2011/0025309 A1 | 2/2011 | Saruki et al. |
| 2011/0121824 A1 | 5/2011 | Sterling |

OTHER PUBLICATIONS

Non-Final Office Action dated Nov. 7, 2013 for U.S. Appl. No. 13/156,735.

Notice of Allowance dated Mar. 10, 2014 for U.S. Appl. No. 13/156,735.

* cited by examiner

ANGLE MEASUREMENT SYSTEM INCLUDING MAGNET WITH SUBSTANTIALLY SQUARE FACE FOR THROUGH-SHAFT APPLICATIONS

REFERENCE TO RELATED APPLICATION

This application is a continuation of U.S. application Ser. No. 13/156,735 filed on Jun. 9, 2011.

BACKGROUND

Figure 1A:
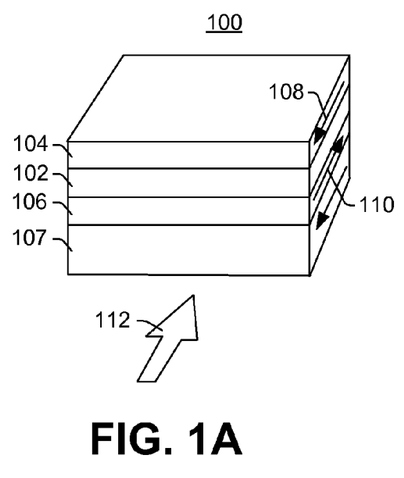
FIGS. 1A-1B are isometric diagrams depicting how one example of how a magnetic field directionality sensor can operate.
Figure 1B:
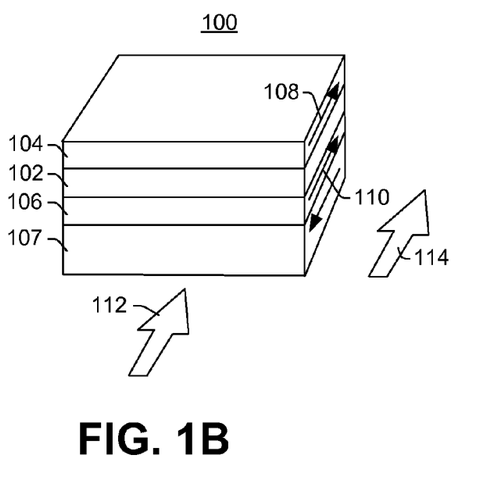

Magnetic field directional sensors, such as Giant Magneto Resistive (GMR) or Anisotropic Magneto Resistive (AMR) sensors, for example, are used in a wide variety of applications. FIGS. 1A-1B show a how a magnetic field directional sensor 100 (e.g., GMR sensor) behaves under different magnetic fields. The magnetic field directional sensor 100 includes a nonmagnetic conducting middle layer 102 (e.g., an ultrathin copper layer) sandwiched between first and second ferromagnetic alloy layers 104, 106. An artificial anti-ferromagnetic layer 107 is disposed under the second ferromagnetic allow layer 106. Additional layers can also be included. As will be appreciated in more detail below, the resistance of the magnetic field directional sensor 100 varies depending on the magnitude and direction of a magnetic field applied to the sensor 100.

FIG. 1A shows a condition where no external magnetic field is applied to the sensor 100. Under this condition, the magnetic moments of the first and second alloy layers 104, 106 face opposite directions (see arrows 108, 110) due to anti-ferromagnetic coupling, and the current 112 attempting to pass through the sensor 100 encounters a large resistance.

In contrast, in FIG. 1B an external magnetic field as shown by arrow 114 has been applied to overcome anti-ferromagnetic coupling. Within the first and second alloy layers 104, 106; this magnetic field 114 tends to align the magnetic moments, as shown by arrows 116, 118. As a consequence, the current 120 attempting to pass though the sensor 100 in FIG. 1B encounters a low resistance, relative to FIG. 1A. Thus, by monitoring the resistance of the sensor 100, the magnitude and/or direction of a magnetic field (e.g., 114) can be evaluated.

Figure 2A:
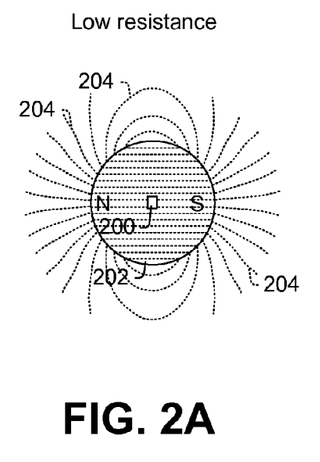
FIGS. 2A-2C are top views of a conventional button magnet mounted atop a rotating shaft.
Figure 2B:
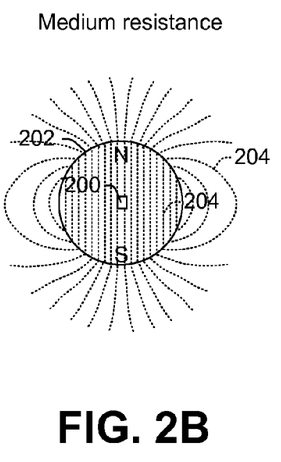
Figure 2C:
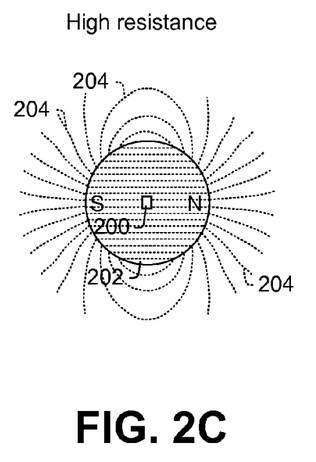

One particular application of interest for GMR/AMR sensors is determining an angular position of a rotating shaft. In conventional solutions, a permanent magnet, sometimes referred to as a "button" magnet, can be mounted to an end of a rotating shaft so as to be centered on the shaft's axis of rotation. FIGS. 2A-2C show top views of such a button magnet 202 as it rotates, wherein a magnetic field directional sensor 200 (e.g., GMR or AMR) is positioned there over so as to remain stationary as the button magnet 202 rotates there under. Within the confines of the button magnet 202, magnetic field lines 204 are straight and parallel to one another. As the shaft (and hence button magnet 202) rotate, the directionality of the magnetic field lines 204 passing though the sensor 200 change accordingly. For example, in FIG. 2A (e.g., a 0° angular position) the magnetic field lines 204 tend to align the magnetic moments of layers in the sensor 200, thereby creating a low resistance state in the sensor 200. However, as the magnetic field lines 204 rotate (FIGS. 2B—a 90° angular position, FIG. 2C—a 180° angular position) they no longer align the magnetic moments as strongly, and the resistance of the sensor 200 can increase proportionately. Because the resistance of the sensor 200 changes depending on the directionality of the magnetic field lines 204 passing there though, a controller (not shown) can measure the resistance of the sensor 200 over time and continuously correlate the resistance at any given time to a corresponding magnetic field direction. In this way, the controller can determine the rotational angle of the shaft as the shaft rotates. In other cases the angle calculation is completed by an intelligent state machine and firmware included in the sensor's manufacturing process. How the angle is ultimately calculated is dependent on the level of sensor integration.

Unfortunately, in many applications, it isn't feasible to mount a circular button magnet on an end of a rotating shaft, for example, due to space concerns or due to some other component needing to be mounted to the end of the shaft. For example, in vehicles, both ends of an electric drive motor shaft may be used to drive two independent systems leaving no access at the shaft ends for a magnet and sensor.

Therefore, improved angle sensing techniques are needed wherein angle sensors are disposed along the length of a shaft, rather than at an end of the shaft.

DETAILED DESCRIPTION

The claimed subject matter is now described with reference to the drawings, where like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details.

Aspects of the present disclosure relate to techniques for measuring an angular position of a rotating shaft. As will be described in greater detail below, some embodiments of the present disclosure include a magnet mounted radially or peripherally about the axial length of a shaft. The magnet includes first and second face surfaces, each of which is substantially square. It will be appreciated that "substantially square" in the context of this disclosure can mean actually square or approximately square (e.g., square with rounded corners). By including substantially square magnets with through-holes for rotating shaft applications, more accurate angle measurements can be taken relative to previous implementations.

Figure 3A:
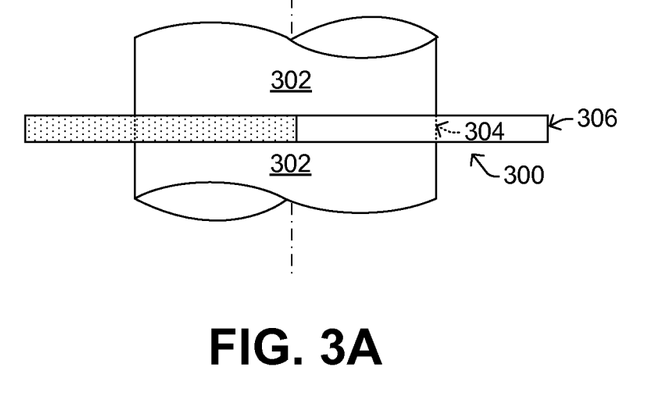
FIGS. 3A-3B are side and top views, respectively, of a ring magnet mounted radially about a rotatable shaft that suffers from some shortcomings.
Figure 3B:
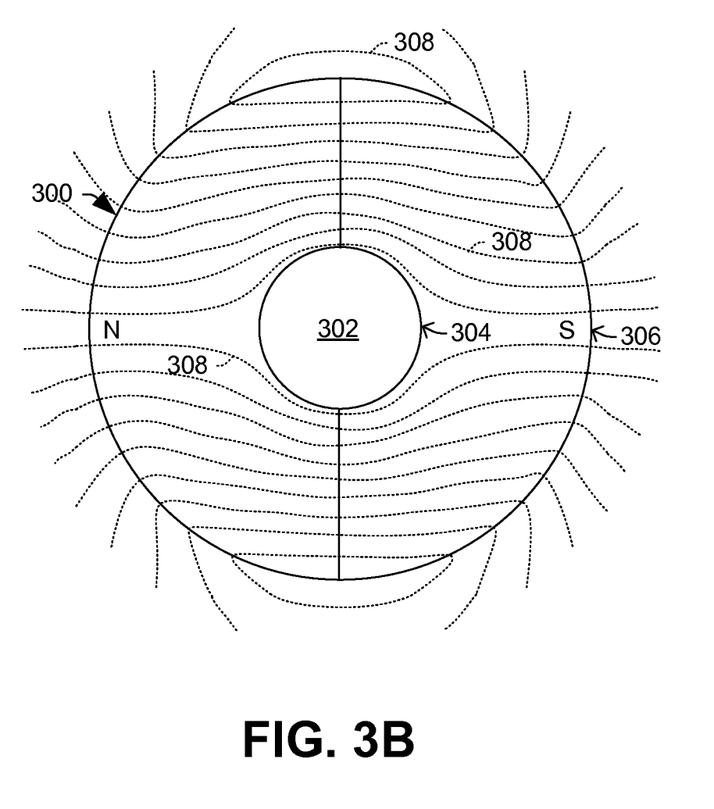

FIGS. 3A-3B show a side view and top view, respectively, of a ring magnet 300 that is mounted radially about a rotatable shaft 302 and which suffers from some shortcomings. Compared to the button magnet shown in FIG. 2, this ring magnet 300 is advantageous in that it includes a through-hole 304 so it can be mounted about the axial length of the shaft 302. Also, because the ring magnet 300 has a continuous, circular edge 306, it is relatively straightforward to manufacture and exhibits good balance (e.g., limited "wobble") as the shaft 302 rotates. Unfortunately, however, unlike conventional button magnets (e.g., button magnet 202 in FIG. 2) which provided straight and parallel magnetic field lines, magnetic field lines 308 in the ring magnet 300 are no longer straight and parallel to one another, due to the through hole 304 in the center of the magnet 300. These "crooked" field lines 308 make accurate angle measurement more difficult, further exacerbated with sensor positions offset from center, than compared with that of conventional button magnets. Thus, FIG. 3's ring magnet 300 is less than ideal for many applications.

To make magnetic field lines more straight and parallel to one another, the present disclosure makes use of substantially square magnets with through-holes therein. It will be appreciated that "substantially square" magnets include magnets that are precisely square as well as magnets that are approximately square (e.g., have rounded corners or other small deviations from being square.) In addition, although through-holes in many instances are circular to accommodate a circular shaft, through-holes can in general have any other shape, such as square, for example. By providing straighter and more parallel magnetic field lines, such substantially square magnets tend to enable greater precision and accuracy when rotational angles of a shaft are measured.

Figure 4A:
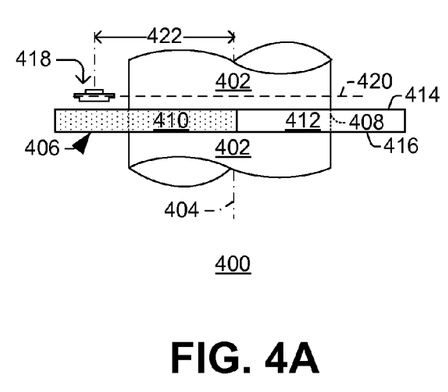
FIGS. 4A-4B are side and top views, respectively, of a square magnet mounted about a rotatable shaft in accordance with some embodiments.
Figure 4B:
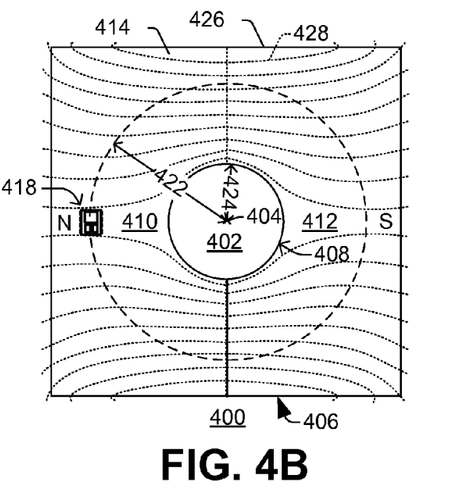

FIGS. 4A-4B illustrate a side view and top view, respectively, of an angle measurement system 400 that includes a square magnet 406. The angle measurement system 400 is configured to determine an angle of a rotating shaft 402, which extends along a shaft axis 404. The square magnet 406, which includes a through-hole 408 centrally disposed through a north pole region 410 and a south pole region 412, is fixedly mounted to the shaft 402. The square magnet 406 includes first and second face surfaces 414, 416, respectively. The first and second face surfaces 414, 416 include first and second apertures, respectively, which define the extents of the through-hole 408 through which the shaft 402 passes.

An angle sensor 418 is configured to measure a time-varying magnetic field produced by the square magnet 406 as the shaft 402 rotates about its axis 404. In many embodiments, the angle sensor 418 comprises a semiconductor chip having one or more resistor (e.g., GMR or AMR resistor) regions. The angle sensor 418 is often positioned in a plane 420 parallel to the first and/or second face surface (416, 418) such that the resistor region is substantially centered along a constant radius 422 extending from the shaft axis 404. The angle sensor 418 is often positioned on the plane 420 between an inner radius 424 and an outer perimeter 426 of square magnet 406.

Compared to the round edge 306 of ring magnet 300 of FIG. 3, the square face surfaces 414, 416 of the magnet 406 help to "straighten" and parallelize the magnetic field lines 428 somewhat. Because of this, the square magnet 406 facilitates more precise angular rotation measurement than the ring magnet 300 of FIG. 3.

Figure 5A:
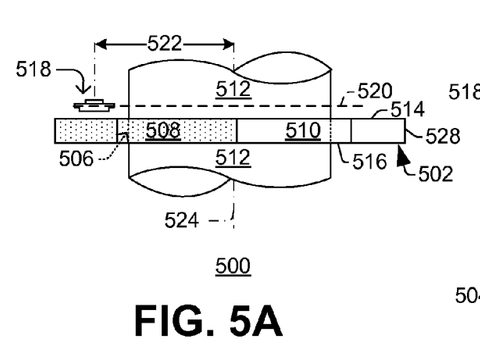
FIGS. 5A-5B are side and top views, respectively, of a square magnet with rounded corners mounted about a rotatable shaft in accordance with some embodiments.
Figure 5B:
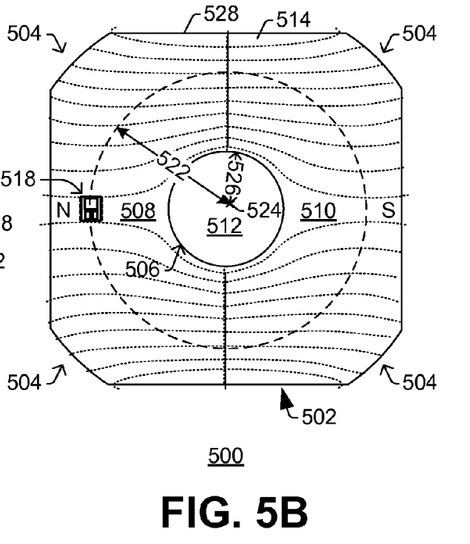

FIGS. 5A-5B illustrate a side view and top view, respectively, of another embodiment of an angle measurement system 500. Rather than including first and second face surfaces that are actually square as depicted in the embodiment of FIGS. 4A-4B, the angle sensor 500 includes a substantially square magnet 502 with rounded corners 504. These rounded corners 504 can help to further parallelize the magnetic field lines compared to previously discussed implementations, thereby facilitating more accurate angle measurements.

Substantially square magnet 502, which includes a through-hole 506 centrally disposed through a north pole region 508 and a south pole region 510, is fixedly mounted to a shaft 512. The substantially square magnet 502 includes first and second face surfaces 514, 516, respectively. The first and second face surfaces 514, 516 have rounded corners 504 and include first and second apertures, respectively, which define the extents of the through-hole 506 through which the shaft 512 passes.

An angle sensor 518 is configured to measure a time-varying magnetic field produced by the substantially square magnet 502 as the shaft 512 rotates about its axis 524. In many embodiments, the angle sensor 518 comprises a semiconductor chip having one or more resistor (e.g., GMR or AMR resistor) regions. The angle sensor 518 is often positioned in a plane 520 parallel to the first and/or second face surface (514, 516) such that the resistor region is substantially centered along a constant radius 522 extending from the shaft axis 524. On this plane 520, the angle sensor 518 is often positioned between an inner radius 526 and an outer edge 528 of substantially square magnet 502.

Figure 6A:
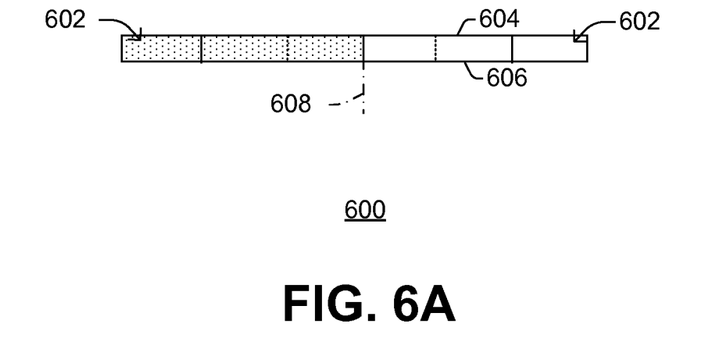
FIG. 6A-6B are side and top views of a square magnet with rounded corners in accordance with some embodiments.
Figure 6B:
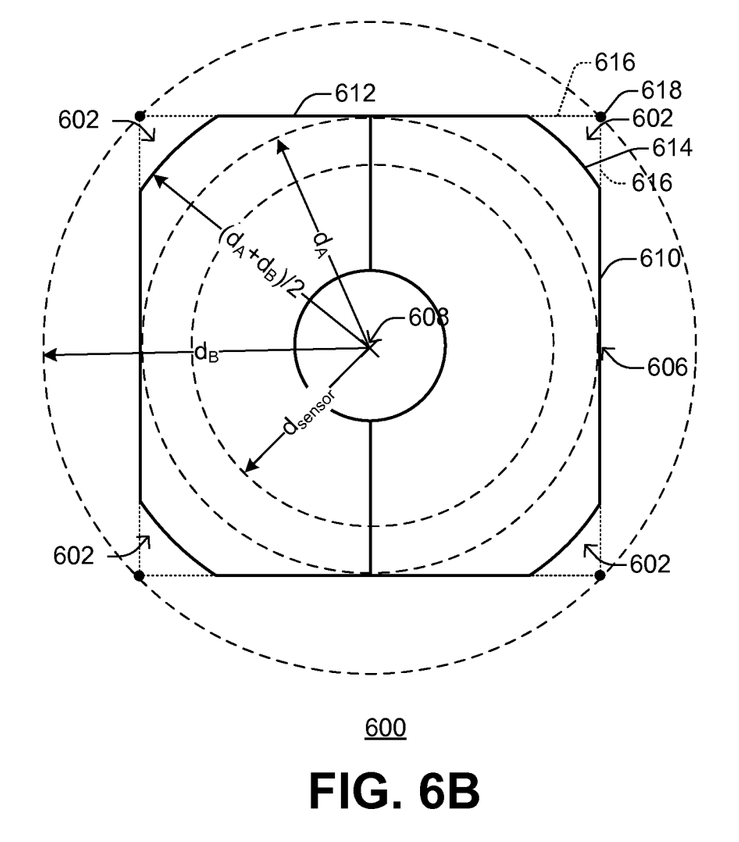

FIGS. 6A-6B show a side view and top view, respectively, of another substantially square magnet 600 with rounded corners 602 in accordance with some embodiments. For purposes of clarity, this embodiment does not show a shaft or angle sensor as with previous embodiments, although this substantially square magnet is typically used in conjunction with them (see e.g., FIG. 5A-5B).

The substantially square magnet 600 includes a first face surface 604, which has a perimeter 606 disposed laterally about a central axis 608 of the magnet. The perimeter 606 includes a first edge 610 spaced apart from the central axis 608 by a first distance $d_A$, and a second edge 612 perpendicular to the first edge 610 and spaced apart from the central axis 608 by the first distance $d_A$. A rounded segment 614 lies between the first edge 610 and the second edge 612 and is spaced apart from the central axis 608 by a second (e.g., radial) distance $d_B$ that is greater than the first distance $d_A$.

The first edge and second edge 610, 612, if extended as shown by lines 616, would meet at an intersection point 618 outside of the first face surface 604. The intersection point 618 is spaced apart from the central axis 608 by a third distance $d_C$ that is greater than the second distance $d_B$.

In some embodiments, the second distance $d_B$ is approximately one half of the sum of the first distance plus the third distance (i.e., $d_B=(d_A+d_C)/2$). This geometry for the rounded corers 602 helps to provide straight and parallel magnetic field lines at a distance at which a sensor will be positioned ($d_{sensor}$).

Figure 7:
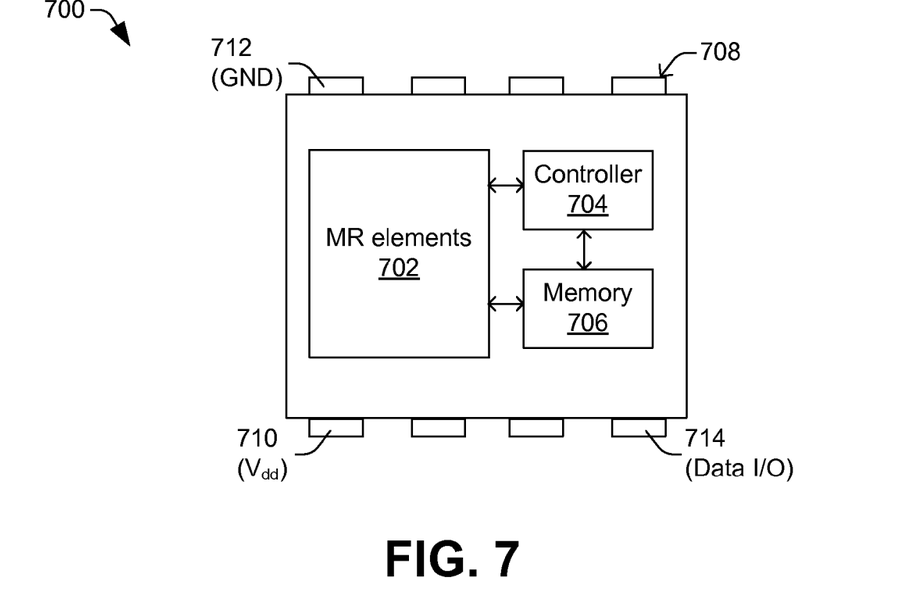
FIG. 7 is a block diagram illustrating one embodiment of a GMR or AMR angle sensor in accordance with some embodiments.

FIG. 7 is a block diagram illustrating one embodiment of an angle sensor 700 (e.g., angle sensor 418 in FIGS. 4A-4B and/or angle sensor 518 in FIGS. 5A-5B). As illustrated, in addition to a magneto-resistive (MR) region 702, angle sensor 700 may further include a controller 704 and a memory 706, with memory 706 storing values for a plurality of MR parameters (e.g., calibration parameters). Angle sensor 700 further includes a plurality of pins 708, such as a supply voltage ($V_{DD}$) pin 710, a ground pin 712, and a data I/O pin 714.

Figure 8:
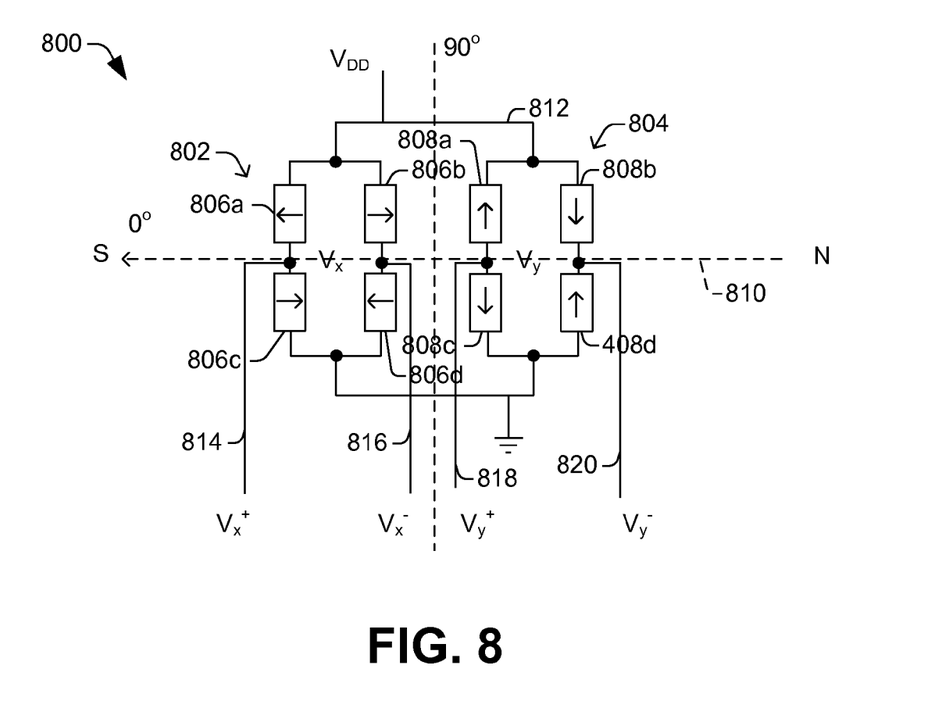
FIG. 8 is a block diagram illustrating one embodiment of a GMR sensing array in accordance with some embodiments.

FIG. 8 is a schematic diagram generally illustrating GMR resistor region 800 (e.g., MR resistor region 702 in FIG. 7) according to one embodiment. As illustrated, GMR resistor region 800 includes a pair of GMR sensor bridges 802 and 804, with sensor bridge 802 formed by four GMR resistors 806a-806d and sensor bridge 804 formed by four GMR resistors 808a-808d. According to the bridge implementation of FIG. 8, GMR sensor bridges 802 and 804 are disposed orthogonal to one another and are respectively configured to sense an x-component and a y-component of a rotating magnetic field, such as the magnetic field indicated by the dashed lines at 810.

A supply voltage $V_{DD}$ is applied to a terminal 812 via pin 710 and voltage signals $V_x+$ and $V_x-$ of GMR sensor bridge 802 are measured at terminals 814 and 816, and voltage signals $V_y+$ and $V_y-$ of GMR sensor bridge 804 are measured at terminals 818 and 820. In response to an external magnetic field, such as magnetic field 810, one or more of the GMR resistors 806a-806d and 808a-808d change in their electrical resistances, causing changes in voltage signals $V_x+$ and $V_x-$ at terminals 814 and 816 and voltage signals $V_y+$ and $V_y-$ at terminals 818 and 820 which are representative of an angular position of magnetic field 810 relative to a reference vector (e.g. 0-degrees).

Although various embodiments have been described above, variations of these embodiments are also contemplated as falling within the scope of the present disclosure.

As may be appreciated from the details above, angle measurement techniques in accordance with the present disclosure may be beneficial in any number of applications that make use of a rotating shaft. In some applications, these techniques can be used to measure both relative angles and an absolute angle. In essence, a relative angle is an angular position measured within a single 360° rotation, while an absolute angle is an angular position that can account for more than one 360° rotation. For example, a relative angular position could measure a 45° rotation relative to true vertical (with no indication of how many 360° rotations passed from a previous measurement), while an absolute angular position could indicate two complete 360° rotations plus a 45° rotation relative to some fixed line of reference (e.g., 765° rotation relative to the fixed line of reference). While GMR sensors can be used to measure virtually any angle (e.g., less than 360 degrees or greater than 360 degrees), AMR sensors are generally only capable of measuring angles of 180 degrees or less.

In some embodiments, a substantially square magnet can be manufactured using an injection molding technique, in which a rubber or plastic material is impregnated with magnetizable material. In other embodiments, a substantially square magnet can be coupled to a shaft in other manners (e.g., fasteners or adhesives).

Further, although the previously illustrated embodiments show only one angle sensor over each magnet, additional (redundant) angle sensors can also be scattered in various ways angle sensing systems in accordance with this disclosure. If present, redundant angle sensors can often lie in a single plane (e.g., plane 420 in FIG. 4) over a substantially square magnet (e.g., 406 in FIG. 4). However, redundant angle sensors can also be "stacked" over one another in these and other implementations. Whatever the arrangement used, redundant angle sensors may help to facilitate reliable angular sensing for a long period of time. Redundant angle sensors also present an opportunity for accuracy confirmation and data quality; if on the PCB the angle sensors are known to be separated by 180 degrees of rotation (for instance) then at any given time these sensors should always provide data separated by 180 degrees, therefore assuring data quality and system accuracy.

As one skilled in the art will appreciate, different companies can refer to a component by different names. This document does not intend to distinguish between components that differ in name but not function herein. In this document the terms "including" and "comprising" are used in an open ended fashion, and thus should be interpreted to mean "including, but not limited to . . . ." Also, the term "couple" (and variations thereof) is intended to mean either an indirect or direct connection. Thus, if a first element is coupled to a second element, that connection may be a direct connection, or may be an indirect connection via other elements and connections. Although various approximately numeric values are provided herein, these numeric values are merely examples should not be used to limit the scope of the disclosure.

Also, although the disclosure has been shown and described with respect to one or more implementations, equivalent alterations and modifications will occur to others skilled in the art based upon a reading and understanding of this specification and the annexed drawings. For example, although this application makes reference to AMR and/or GMR sensors above, it will be appreciated that other magneto-resistive (MR) sensors are also contemplated as falling within the scope of the present disclosure. For instance, tunneling magnetic resistance (TMR) is another type of magnetoresistive effect that can be used in angle sensors in accordance with some embodiments. Other MR sensors could also be included. The disclosure includes all such modifications and alterations and is limited only by the scope of the following claims. In particular regard to the various functions performed by the above described components (e.g., elements and/or resources), the terms used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the disclosure. In addition, while a particular feature of the disclosure may have been disclosed with respect to only one of several implementations, such feature may be combined with one or more other features of the other implementations as may be desired and advantageous for any given or particular application. In addition, the articles "a" and "an" as used in this application and the appended claims are to be construed to mean "one or more".

Furthermore, to the extent that the terms "includes", "having", "has", "with", or variants thereof are used in either the detailed description or the claims, such terms are intended to be inclusive in a manner similar to the term "comprising."

What is claimed is:

1. An angle measurement system, comprising:
   a shaft extending along a shaft axis and configured to axially rotate thereabout;
   a magnet including first and second surfaces, wherein the first and second surfaces include first and second apertures, respectively, and wherein the first and second apertures define extents of a through-hole in the magnet through which the shaft extends so opposing ends of the shaft extend entirely through the magnet and past the first and second surfaces, and
   an angle sensor configured to measure a time-varying magnetic field produced by the magnet as the shaft rotates, wherein the angle sensor includes a sensing region that is positioned over the first surface of the magnet and is radially spaced apart from a sidewall of the shaft;
   where the shaft is adapted to rotate through an absolute angle of more than three-hundred and sixty degrees about the shaft axis.

2. The angle measurement system of claim 1, wherein the first and second surfaces are square or four-sided surfaces with rounded corners.

3. The angle measurement system of claim 1, wherein the angle sensor is configured to determine a rotational angle of the shaft based on the time-varying magnetic field produced by the magnet.

4. The angle measurement system of claim 1, where the angle sensor is fixed at a position that is spaced apart from the shaft axis.

5. The angle measurement system of claim 1, wherein the first surface has a perimeter disposed laterally about the shaft axis, the perimeter comprising:
 a first edge spaced apart from the shaft axis by a first distance;
 a second edge perpendicular to the first edge and spaced apart from the shaft axis by the first distance;
 a rounded segment between the first edge and the second edge and spaced apart from the shaft axis by a second distance that is greater than the first distance.

6. The angle measurement system of claim 5, wherein the first edge and second edge, if extended, would meet at an intersection point outside of the first surface, and wherein the intersection point is spaced apart from the shaft axis by a third distance that is greater than the second distance.

7. The angle measurement system of claim 6, wherein the second distance is approximately one half of the sum of the first distance plus the third distance.

8. The angle measurement system of claim 1, wherein the angle sensor comprises:
 a semiconductor chip that includes an arrangement of magnetoresistive sensors arranged to determine magnetic field directionality.

9. The angle measurement sensor of claim 8, where the semiconductor chip comprises a pair of MR sensor bridges arranged orthogonal to one another.

10. The angle measurement system of claim 1, wherein the angle sensor comprises:
 an ultrathin conducting, non-ferromagnetic layer; and
 a pair of ferromagnetic layers sandwiched about opposing sides of the conducting, non-ferromagnetic layer.

11. The angle measurement system of claim 1, where the first surface and the second surface are substantially flat and comprise one or more rounded corners.

12. A system, comprising:
 a shaft that extends along a shaft axis;
 a magnet having first and second surfaces that are substantially square with rounded corners, wherein the magnet includes an aperture through which the shaft passes so opposing ends of the shaft extend entirely through the magnet and past the first and second surfaces; and
 an angle sensor to determine a rotational angle of the shaft by measuring a time-varying magnetic field produced by the magnet as the shaft rotates, wherein the angle sensor includes a sensing region that is positioned over the first or second surface of the magnet and is radially spaced apart from a sidewall of the shaft;
 where the shaft is adapted to rotate through an absolute angle of more than three-hundred and sixty degrees about the shaft axis.

13. The system of claim 12, where the angle sensor comprises:
 a semiconductor chip that includes an arrangement of Magnetoresistive (MR) sensors arranged to cooperatively determine magnetic field directionality.

14. The system of claim 13, where the semiconductor chip comprises a pair of MR sensor bridges arranged orthogonal to one another.

15. The system of claim 12, wherein the angle sensor comprises:
 an ultrathin conducting, non-ferromagnetic layer; and
 a pair of ferromagnetic layers sandwiched about opposing sides of the conducting, non-ferromagnetic layer.

16. The system of claim 12, wherein the shaft passing through the aperture mounts the magnet to the shaft.

17. The system of claim 12, wherein the sensing region is positioned between an inner perimeter of the magnet proximate to the shaft and an outer perimeter of the magnet.

18. The system of claim 12, wherein the first or second surface of the magnet has a perimeter disposed laterally about the shaft axis, the perimeter comprising:
 a first linear edge which most closely approaches the shaft axis at a first distance as measured on a first line which is perpendicular to the first linear edge and which passes through the shaft axis;
 a second linear edge which is perpendicular to the first linear edge, wherein the second linear edge most closely approaches the shaft axis at the first distance as measured on a second line which is perpendicular to the second linear edge and which passes through the shaft axis;
 a rounded segment connecting the first edge and the second edge, wherein the rounded segment most closely approaches the shaft axis at a second distance as measured on a third line which is perpendicular to the rounded segment and which passes through the shaft axis, wherein the second distance is greater than the first distance,
 wherein the first linear edge and the second linear edge, if extended, would meet at an intersection point outside of the face, and wherein the intersection point is spaced apart from the shaft axis by a third distance,
 wherein the second distance is approximately one half of the sum of the first distance plus the third distance.

* * * * *